United States Patent
Yang et al.

(10) Patent No.: US 11,877,484 B2
(45) Date of Patent: Jan. 16, 2024

(54) DISPLAY PANEL, PREPARATION METHOD FOR DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Shuquan Yang, Beijing (CN); Liqiang Chen, Beijing (CN)

(73) Assignees: Chengdu BOE Optoelectroni cs Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 520 days.

(21) Appl. No.: 17/272,107

(22) PCT Filed: May 21, 2020

(86) PCT No.: PCT/CN2020/091656
§ 371 (c)(1),
(2) Date: Feb. 26, 2021

(87) PCT Pub. No.: WO2020/238767
PCT Pub. Date: Dec. 3, 2020

(65) Prior Publication Data
US 2021/0320167 A1  Oct. 14, 2021

(30) Foreign Application Priority Data

May 30, 2019  (CN) .......................... 201910464413.8

(51) Int. Cl.
*H01L 27/32* (2006.01)
*H10K 59/131* (2023.01)
(Continued)

(52) U.S. Cl.
CPC .......... *H10K 59/131* (2023.02); *H10K 71/00* (2023.02); *H10K 59/1201* (2023.02)

(58) Field of Classification Search
None
See application file for complete search history.

(56) References Cited

U.S. PATENT DOCUMENTS

2018/0308917 A1  10/2018  Cheng et al.
2019/0273124 A1  9/2019  Leng et al.
2021/0320167 A1*  10/2021  Yang .................... H10K 59/131

FOREIGN PATENT DOCUMENTS

CN  106783933 A  5/2017
CN  108288631 A  7/2018
(Continued)

OTHER PUBLICATIONS

CN201910464413.8 First Office Action.
CN201910464413.8 Second Office Action.
CN201910464413.8 Decision of Rejection.

*Primary Examiner* — Jack S Chen
(74) *Attorney, Agent, or Firm* — IPro, PLLC

(57) ABSTRACT

The present disclosure discloses a display panel, a method for preparing the display panel, and a display device. The display panel is divided into a display area and a non-display area. The display panel in the non-display area includes: a substrate; a metal wiring layer arranged on the substrate, the metal wiring layer including metal wirings; a planarization layer covering the substrate and the metal wiring layer, the planarization layer being provided with grooves corresponding to the metal wirings, and the grooves each being located on a side, facing away from the substrate, of a metal wiring corresponding to the each groove and exposing the metal wiring; and a flexible electrode layer filling the grooves, the flexible electrode layer being coupled to the metal wiring layer located at bottoms of the grooves.

19 Claims, 4 Drawing Sheets

(51) Int. Cl.
*H10K 71/00* (2023.01)
*H10K 59/12* (2023.01)

(56) References Cited

FOREIGN PATENT DOCUMENTS

| | | |
|---|---|---|
| CN | 108389869 A | 8/2018 |
| CN | 108695357 A | 10/2018 |
| CN | 108735777 A | 11/2018 |
| CN | 108831909 A | 11/2018 |
| CN | 108962945 A | 12/2018 |
| CN | 110164312 A | 8/2019 |

\* cited by examiner

Imprint the organic planarization layer, and remove a part of the organic planarization layer in imprinted areas to form grooves — 801

FIG. 8

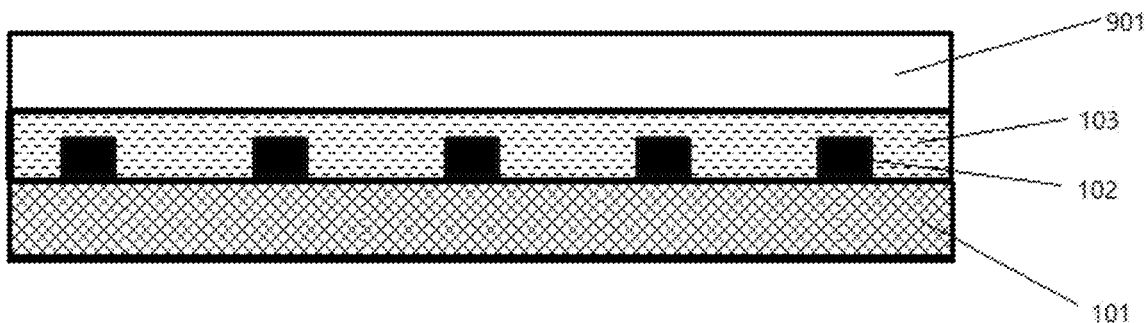

FIG. 9

After removing the part of organic planarization layer in imprinted areas, curing a surface of the organic planarization layer — 1001

Perform surface treatment on a surface of the metal wiring layer exposed in the grooves — 1002

FIG. 10

Fill a flexible electrode material with a predetermined thickness on the metal wiring layer in grooves to form the flexible electrode layer — 1101

FIG. 11

DISPLAY PANEL, PREPARATION METHOD FOR DISPLAY PANEL AND DISPLAY DEVICE

CROSS REFERENCE TO RELATED APPLICATIONS

This application claims priority of Chinese Patent Application No. 201910464413.8, filed with the State Intellectual Property Office of P. R. China on May 30, 2019 and entitled "Display Panel, Method for Preparing Display Panel, and Display Device", the entire content of which is incorporated herein by reference.

FIELD

The present application relates to the technical field of display, in particular to a display panel, a method for preparing the display panel, and a display device.

BACKGROUND

At present, in schemes of increasing the screen-to-body ratio of a flexible organic semiconductor display module, a non-display area is generally folded back to the back of a display area in a bending mode, a narrow bezel of the display area is thus achieved. However in the bending process, it is difficult to ensure that communication wire(s) in the non-display area do not break during bending. In the related art, a buffer layer, a gate insulating layer and an interlayer insulating layer formed by brittle inorganic insulating material(s) in the non-display area are generally removed through an etching scheme, and both sides of a metal wiring layer are filled with organic material(s) so as to ensure that no fracture occurs in the bending process. The related art also includes other technical schemes such as patterning metal wires in the non-display area, thinning a back film of a bending portion and a substrate, and optimizing a bending track. However, according to current actual production situations, a certain proportion of metal wires will be broken in the production process and reliability tests.

SUMMARY

The present application provides a display panel, a method for preparing the display panel, and a display device, so as to solve the problem that a certain proportion of metal wires are likely to be broken when a non-display area is folded to a display area in an existing bending mode.

In order to solve the above problem, the present application discloses a display panel. The display panel is divided into a display area and a non-display area. The display panel in the non-display area includes:
a substrate;
a metal wiring layer arranged on the substrate, the metal wiring layer including a plurality of metal wirings;
a planarization layer covering the substrate and the metal wiring layer, the planarization layer being provided with a plurality of grooves corresponding to the metal wirings, and the grooves each being located on a side, facing away from the substrate, of a metal wiring corresponding to the each groove and exposing the metal wiring; and
a flexible electrode layer filling the grooves, the flexible electrode layer being coupled to the metal wiring layer located at bottoms of the grooves.

Further, the display panel in the non-display area further includes an organic protective layer covering the planarization layer.

Further, corresponding to any one of the metal wirings of the metal wiring layer, the planarization layer is provided with a respective one of the grooves.

Further, a pattern shape of the flexible electrode layer is substantially the same as a pattern shape of the metal wiring layer exposed by the grooves of the planarization layer.

Further, a filling thickness of the flexible electrode layer filling a groove is less than a depth of the groove.

Further, a material for preparing the flexible electrode layer includes any one of silver nanowires, silver paste and graphene.

The present application also discloses a method for preparing a display panel, and the method includes:
providing a substrate;
forming a metal wiring layer on a non-display area of the substrate;
forming a planarization layer on the non-display area of the substrate and the metal wiring layer;
processing the planarization layer to form a plurality of grooves, the grooves being located on a side, facing away from the substrate, of the metal wiring layer and exposing the metal wiring layer; and
forming a flexible electrode layer in the grooves, the flexible electrode layer being coupled to the metal wiring layer located at bottoms of the grooves.

Further, after the flexible electrode layer is formed in the grooves, the method further includes: forming an organic protective layer on the flexible electrode layer.

Further, processing the planarization layer to form the plurality of grooves includes:
patterning the planarization layer to form the grooves.

Further, processing the planarization layer to form the plurality of grooves includes:
imprinting the planarization layer, and removing a part of the planarization layer in imprinted areas to form the grooves.

Further, the method further includes: curing a surface of the planarization layer after removing the part of the planarization layer in the imprinted areas.

Further, before forming the flexible electrode layer in the grooves, the method further includes:
performing surface treatment on a surface of the metal wiring layer exposed in the grooves to remove a residual part of the planarization layer on the surface of the metal wiring layer.

Further, forming the flexible electrode layer on the metal wiring layer exposed in the grooves includes:
filling a flexible electrode material with a predetermined thickness on the metal wiring layer in the grooves to form the flexible electrode layer.

In order to solve above problems, the present application also discloses a display device, and the display device includes the display panel.

BRIEF DESCRIPTION OF THE DRAWINGS

FIG. 8 is a flowchart of another sub-step in a method for preparing a display panel according to an embodiment of the present application.

FIG. 9 is a schematic diagram of imprinting a planarization layer and removing part of the planarization layer in imprinted areas to form grooves according to an embodiment of the present application.

FIG. 10 is a flowchart of sub-steps in a method for preparing a display panel according to an embodiment of the present application.

FIG. 11 is a flowchart of a sub-step in a method for preparing a display panel according to an embodiment of the present application.

DETAILED DESCRIPTION OF THE EMBODIMENTS

In order to make the above objects, features and advantages of the present application more obvious and understandable, the present application will be further described in detail below in combination with the accompanying drawings and detailed embodiments.

Figure 1:
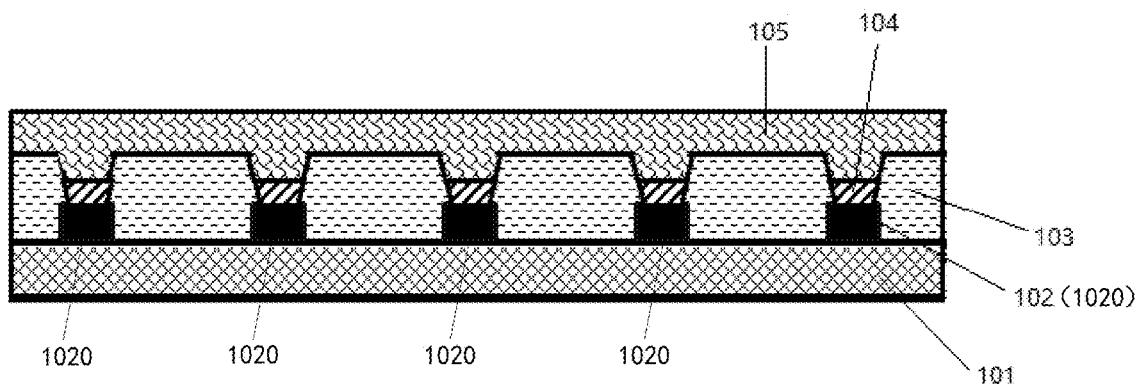
FIG. 1 is a schematic structural diagram of a display panel according to an embodiment of the present application.
Figure 2:
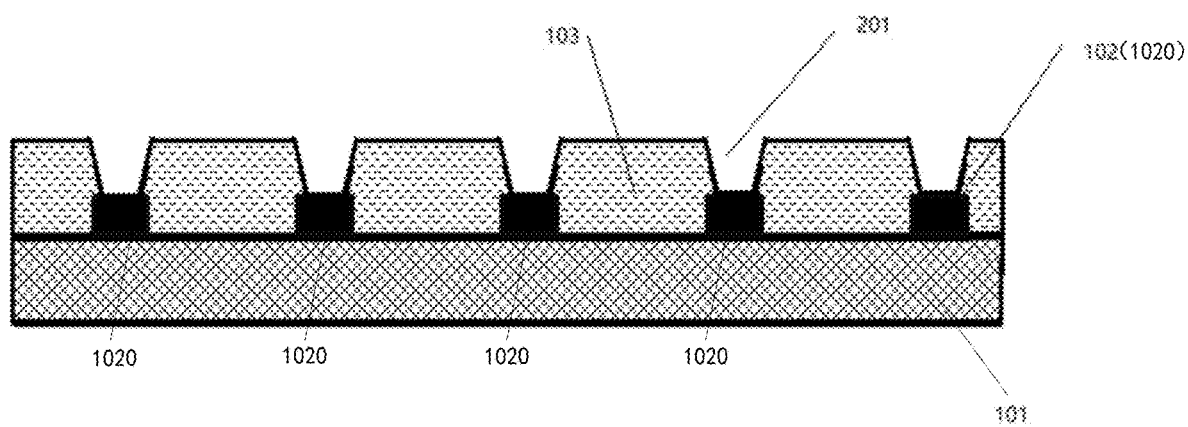
FIG. 2 is a schematic structural diagram of a display panel after forming grooves according to an embodiment of the present application.

Referring to FIG. 1 and FIG. 2, FIG. 1 and FIG. 2 illustrate a cross-sectional structural diagram of a non-display area of a display panel according to an embodiment of the present application. The display panel is divided into a display area and the non-display area. The display panel in the non-display area includes:

a substrate 101;

a metal wiring layer 102 arranged on the substrate 101, the metal wiring layer 102 including a plurality of metal wirings 1020;

a planarization layer 103 covering the substrate 101 and the metal wiring layer 102, the planarization layer 103 being provided with a plurality of grooves 201 corresponding to the metal wirings 1020, and the grooves 201 each being located on a side, facing away from the substrate 101, of a metal wiring 1020 corresponding to the each groove and exposing the metal wiring 1020; and a flexible electrode layer 104 filling the grooves 201, the flexible electrode layer 104 being coupled to the metal wiring layer 102 located at bottoms of the grooves 201.

According to embodiments of the present application, the substrate may be a flexible substrate, so that the substrate does not break in a bending process of the non-display area. In the bending process of the non-display area, the metal wiring layer arranged on the substrate may be broken with certain probability, resulting in the technical problem of interruption of signal transmission on the metal wiring layer. Embodiments of the application solve the problem by arranging the flexible electrode layer coupled to the metal wiring layer on the metal wiring layer.

According to embodiments of the present application, the planarization layer is patterned to obtain the plurality of grooves. Optionally, through an imprinting method, a soft pressed film with a microstructure can be gradually pressed to be combined with the planarization layer in a roll-in mode, and a part of the planarization layer in imprinted areas are removed to obtain the plurality of grooves. Specific implementations are not limited in the embodiments of the present application. The formed grooves are located on the side, facing away from the substrate, of the metal wiring layer. Optionally, the groove is of a structure with a large opening in one side and a small opening in the other side, and the side with the small opening is located on the metal wiring layer. The side with the large opening of the groove is subjected to inkjet printing or coating to fill a flexible electrode material with a predetermined thickness on the metal wiring layer in the groove to form the flexible electrode layer. The groove adopts the structure with the large opening in one side and the small opening in the other side, so that the flexible electrode material is easier to fill compared with a structure with the same openings on both sides of the groove. The flexible electrode material forming on the metal wiring layer forms the flexible electrode layer. The flexible electrode layer is coupled to the metal wiring layer to form dual-channel wirings. Resistance is reduced while it is ensured that even if lower metal wiring layer is broken, signals can still be transmitted through the upper flexible electrode layer.

Optionally, referring to FIG. 1, the display panel in the non-display area further includes a protective layer 105 covering the planarization layer 103. Optionally, the protective layer 105 is of an organic material.

In some embodiments, referring to FIG. 1 and FIG. 2, the planarization layer 103 and the protective layer 105 are both of organic material(s). The protective layer 105 is located on the planarization layer 103 and covers the flexible electrode layer 104 arranged in the grooves 201, so that the flexible electrode layer 104 is completely wrapped by the planarization layer 103 and the protective layer 105. Therefore, the flexible electrode layer 104 is well protected and buffered. The flexible electrode layer 104 is prevented from being corroded, and the flexible electrode layer 104 is further prevented from being broken.

In some embodiments, referring to FIG. 1 and FIG. 2, corresponding to any one of the metal wiring 1020 of the metal wiring layer 102, the planarization layer 103 is provided with a respective one of the grooves 201.

In embodiments of the present application, the grooves may be formed on each metal wiring of the metal wiring layer. The flexible electrode layer is formed by filling the grooves with the flexible electrode material. Therefore, the technical problem of interruption of signal transmission caused by fracture of any wiring of the metal wiring layer in the bending process can be solved.

In some embodiments, the grooves may be formed on metal wirings, which are prone to breakage, of the metal wiring layer, and the metal wirings which are prone to breakage are metal wirings in a bending area of the non-display area. The number of grooves can be reduced by only providing the grooves on the metal wirings, which are prone to breakage, of the metal wiring layer, use of the flexible electrode material is also reduced, and an effect of stable signal transmission can be ensured.

In some embodiments, a pattern shape of the flexible electrode layer is substantially the same as a pattern shape of the metal wiring layer exposed by the grooves of the planarization layer. For example, the metal wiring layer includes the plurality of wirings. The planarization layer is provided with the plurality of grooves respectively located on the plurality of wirings and exposing the plurality of wirings. Each groove and the corresponding wiring below the groove are substantially the same in shape. For example, the groove and the corresponding wiring below the groove extend linearly and extend in the same direction. Furthermore, the pattern shape of the flexible electrode layer in the plurality of grooves is substantially the same as the pattern shape of the metal wiring layer exposed at bottoms of the plurality of grooves. Further, lengths and widths of the grooves are not limited, may be substantially the same as lengths or widths of the corresponding wirings below the grooves, and may also be greater or less than the lengths and widths of the wirings.

In some embodiments, referring to FIG. 1 and FIG. 2, a filling thickness of the flexible electrode layer 104 filling a groove is less than a depth of the groove 201.

In embodiments of the present application, the filling thickness of the flexible electrode layer arranged in a groove is less than the depth of the groove. In principle, by reducing the filling thickness of the flexible electrode material, the thickness of the planarization layer can be reduced, so that the thickness of a film layer in the bending area is thin, and the probability of breakage of the metal wiring layer when a backplane is bent can be reduced. In addition, the thickness of the flexible electrode layer is less than the depth of the groove, so that filling operation of the flexible electrode layer material is facilitated, and short circuits between the wirings of the flexible electrode layer can be avoided. In addition, through arrangement that the filling thickness of the flexible electrode layer is less than the depth of the groove, the protective layer can be conveniently used to cover the flexible electrode layer in the grooves to protect flexible electrodes from corrosion.

In some embodiments, a material for preparing the flexible electrode layer includes any one of silver nanowires, silver paste and graphene.

In embodiments of the present application, the silver nanowires, the silver paste and the graphene have good electrical conductivity and bending resistance. The silver nanowires, or the silver paste or the graphene fills the grooves in an inkjet printing or coating mode and forms good contact with the lower metal wiring layer. It can be ensured that when the lower metal wiring layer is broken, the upper flexible electrode layer will not break, and the signals can still be conducted through the upper flexible electrode layer.

According to the display panel in embodiments of the present application, the flexible electrode layer is formed on the metal wiring layer, and the dual-channel wirings are formed by adopting the metal wiring layer and the flexible electrode layer, so that the resistance is reduced while it is ensured that after the lower metal wiring layer is broken, the signals can still be conducted through the upper flexible electrode layer.

Figure 3:
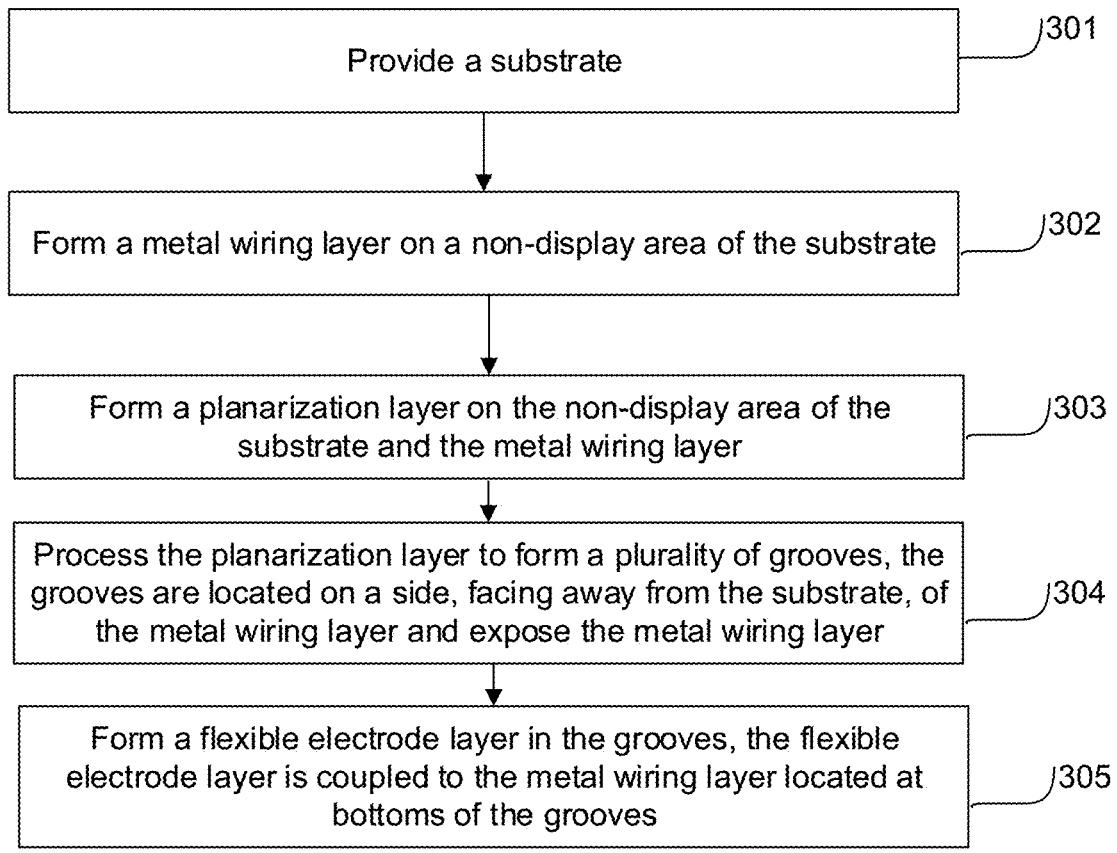
FIG. 3 is a flowchart of a method for preparing a display panel according to an embodiment of the present application.

Referring to FIG. 3, embodiments of the present application also disclose a method for preparing a display panel. The method includes the following steps.

Step 301, a substrate is provided.

In embodiments of the present application, the substrate is a flexible substrate. Optionally, the substrate may be made of an organic flexible material, such as polyimide (PI), polycarbonate (PC), polyethersulfone (PES) and the like. In an embodiment provided by the present application, PI is used as a manufacturing material of the substrate. For example, the substrate can be formed by depositing the PI on a glass substrate through a thermal chemical deposition method, and after each film layer is deposited on the substrate, the glass substrate is removed.

Step 302, a metal wiring layer is formed on a non-display area of the substrate.

In embodiments of the present application, the metal wiring layer is arranged on the non-display area of the substrate in a plating mode according to a predetermined pattern. For example, the metal wiring layer is of a Ti—Al—Ti structure.

Step 303, a planarization layer is formed on the non-display area of the substrate and the metal wiring layer.

In embodiments of the present application, the non-display area of the substrate and the metal wiring layer are coated with a planarization layer material to form the planarization layer. The planarization layer material includes any one of acrylic resin, epoxy resin and organic silicon resin. The thickness of the planarization layer is determined by thickness of the metal wiring layer and thickness of the flexible electrode layer arranged on the metal wiring layer. The thinner the thickness of the planarization layer, the better the bending resistance of the non-display area of the display panel.

Step 304, the planarization layer is processed to form a plurality of grooves, the grooves are located on a side, facing away from the substrate, of the metal wiring layer and expose the metal wiring layer.

In embodiments of the present application, the grooves are formed by removing the planarization layer above the metal wiring layer. For example, the grooves are of structures with large openings in one ends and small openings in the other ends, and the openings in the ends, close to the metal wiring layer, of the grooves are small. The grooves are configured to be of the structures with the large openings in one ends and the small openings in the other ends to facilitate execution of other subsequent operations, for example, to facilitate formation of the flexible electrode layer in the grooves.

Optionally, after the grooves are formed, and before the flexible electrode layer is formed in the grooves, the following steps can be further included. Surface treatment is carried out on a surface of the metal wiring layer exposed in the grooves to completely remove the organic planarization layer on the metal wiring layer and ensure effectiveness of subsequent operations, for example, to ensure good coupling between the flexible electrode layer and the metal wiring layer. For example, the surface of the metal wiring layer exposed in the grooves can be specifically subjected to plasma surface treatment.

Step 305, the flexible electrode layer is formed in the grooves, and the flexible electrode layer is coupled to the metal wiring layer located at bottoms of the grooves.

In embodiments of the present application, before the flexible electrode layer is formed on the metal wiring layer exposed in the grooves, the organic planarization layer on the metal wiring layer needs to be completely removed to ensure good contact between the flexible electrode layer and the metal wiring layer, and effectiveness of signal transmission is achieved.

Figure 4:
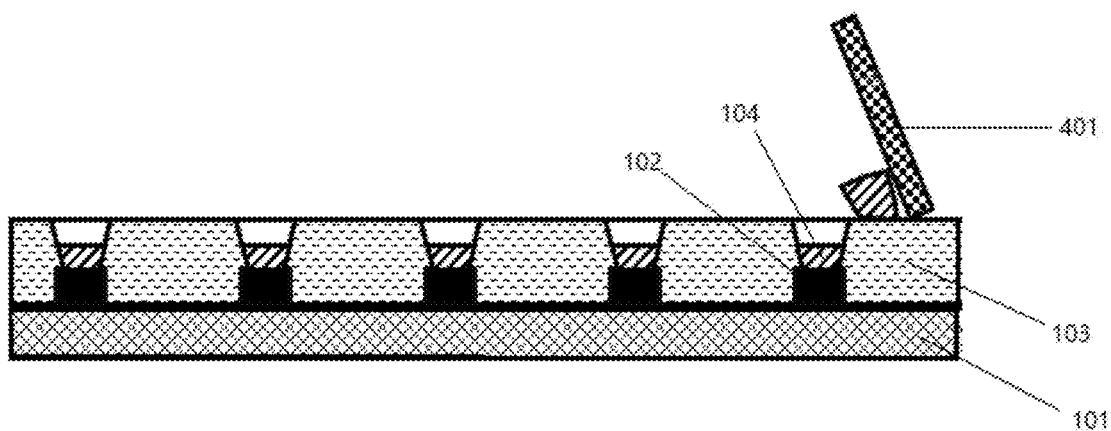
FIG. 4 is a schematic diagram of coating a flexible electrode material by using a coating jig according to an embodiment of the present application.
Figure 5:
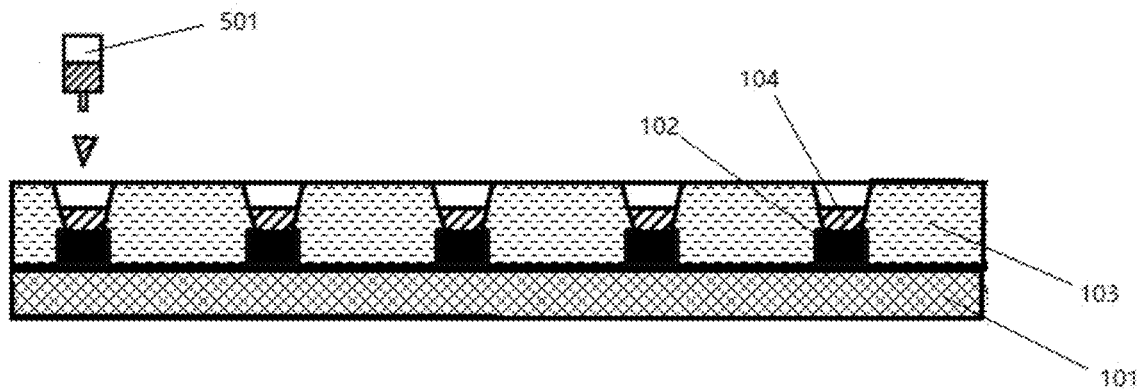
FIG. 5 is a schematic diagram of printing a flexible electrode material by using a printing nozzle according to an embodiment of the present application.

In some embodiments, referring to FIG. 4, a coating jig 401 can be used to coat the metal wiring layer 102 with the flexible electrode material to form the flexible electrode layer 104. Referring to FIG. 5, a printing nozzle 501 can also be used to print the flexible electrode material on the metal wiring layer 102 to form the flexible electrode layer 104.

In some embodiments, after the flexible electrode layer is formed in the grooves, the following steps can be further included.

Step 306, an organic protective layer is formed on the flexible electrode layer.

In embodiments of the present application, the flexible electrode layer is coated with the protective layer to cover the flexible electrode material in the grooves, so as to protect flexible electrodes from corrosion, and the flexible electrode layer is wrapped by the organic planarization layer and the organic protective layer and is not liable to break. For example, a material for preparing the protective layer may be any one of flexible polyimide, epoxy resin, and acrylic.

Figure 6:
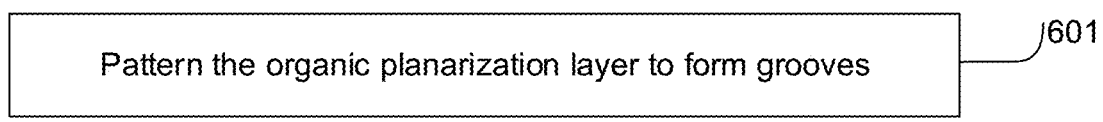
FIG. 6 is a flowchart of a sub-step in a method for preparing a display panel according to an embodiment of the present application.

Referring to FIG. 6, in some embodiments, processing the planarization layer to form the plurality of grooves includes step 601.

Step 601, patterning processing is carried out on the planarization layer to form the grooves.

Figure 7:
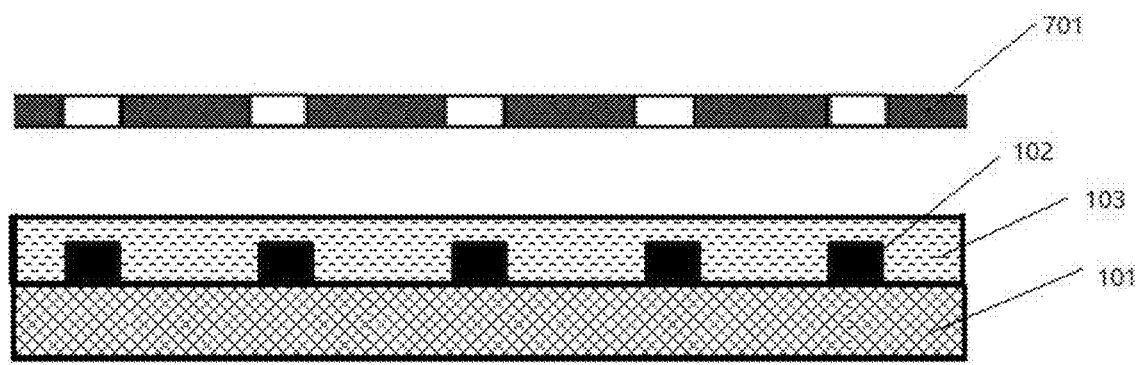
FIG. 7 is a schematic diagram of patterning a planarization layer to form grooves according to an embodiment of the present application.

In embodiments of the present application, referring to FIG. 7, a surface of the side, facing away from the substrate, of the planarization layer 103 is coated with a photoresist. A mask 701 is arranged above the planarization layer 103, and the mask 701 is irradiated with light to expose and develop the photoresist. Finally, the photoresist and the planarization layer material in an exposure area are removed until the metal wiring layers 102 are exposed, and the grooves 201 shown in FIG. 2 are obtained.

Referring to FIG. 8, in some embodiments, processing the planarization layer to form the plurality of grooves includes step 801.

Step 801, the planarization layer is imprinted, and a part of the planarization layer in imprinted areas is removed to form the grooves.

In embodiments of the present application, referring to FIG. 9, a soft pressed film 901 with a microstructure covers the side, away from the substrate 101, of the planarization layer 103. The soft pressed film 901 is gradually pressed to be combined with the planarization layer 103 in a roll-in mode, and then the planarization layer material with the microstructure in the imprinted areas on the planarization layer is removed until the metal wiring layer 102 is exposed, and the grooves 201 shown in FIG. 2 are obtained. In some embodiments, the microstructure is arranged in a first area of the soft pressed film, and the first area is an area, corresponding to all the metal wirings in the metal wiring layer, in the soft pressed film. In another implementation of the present application, the first area is an area, corresponding to metal wirings which are easily broken, in the soft pressed film, for example, the easily broken metal wirings are metal wirings in the bending area of the non-display area.

In some embodiments, referring to FIG. 10, the method further includes step 1001.

Step 1001, after removing the part of the planarization layer in the imprinted areas, the surface of the planarization layer is subjected to curing treatment.

Further, after curing the surface of the planarization layer, step 1002 may be further included, i.e., surface treatment is carried out on the surface of the exposed metal wiring layer.

In embodiments of the present application, after removing the part of the planarization layer in the imprinted areas, the obtained exposed surfaces of the grooves formed by the planarization layer are subjected to curing treatment, so that the exposed surfaces of the grooves of the planarization layer are more stable in structure. In some embodiments, the curing treatment includes UV curing or thermal curing molding. The curing treatment can also be performed through other methods, which are not limited in the present application.

In embodiments of the present application, surface treatment is performed on the metal wiring layer in the grooves to remove residual organic layers on the surface of the metal wiring layer and improve conductivity of metal surfaces. In some embodiments, a plasma surface treatment method is adopted to perform surface treatment on the metal wiring layer in the grooves.

In some embodiments, referring to FIG. 11, forming the flexible electrode layer in the grooves includes step 1101.

Step 1101, the flexible electrode material with the predetermined thickness is filled on the metal wiring layer in the grooves to form the flexible electrode layer.

In embodiments of the present application, inkjet printing is adopted to fill the flexible electrode material in the grooves. When the flexible electrode material fills in the grooves by inkjet printing, a printing path and a printing volume are set according to shapes of the grooves and the predetermined thickness to achieve filling of the flexible electrode material. The flexible electrode material includes one of silver nanowires, silver paste or graphene. After the flexible electrode material is formed to form the flexible electrode layer, the organic protective layer is prepared on the flexible electrode layer and the planarization layer to protect the exposed flexible electrode layer.

In embodiments of the present application, a coating method is adopted to fill the flexible electrode material on the metal wiring layer in the grooves according to the predetermined thickness. When the flexible electrode material fills on the metal wiring layer in the grooves according to the predetermined thickness by coating, the metal wiring layer is coated with the flexible electrode material by using the coating jig to form the flexible electrode layer. The flexible electrode material includes one of silver nanowires, silver paste, or graphene. After the flexible electrode material is formed to form the flexible electrode layer, the organic protective layer is prepared on the flexible electrode layer and the planarization layer to protect the exposed flexible electrode layer.

According to the method for preparing the display panel described in embodiments of the present application, the flexible electrode layer is formed on the metal wiring layer, and dual-channel traces are formed by adopting the metal wiring layer and the flexible electrode layer, so that the resistance is reduced while it is ensured that after the lower metal wiring layer is broken, signals can still be conducted through the upper flexible electrode layer.

Embodiments of the present application also disclose a display device. The display device includes a display panel described in any one embodiment of the above. The display panel is divided into a display area and a non-display area. The display panel in the non-display area includes a substrate, a metal wiring layer arranged on the substrate; and a planarization layer covering the substrate and the metal wiring layer. The planarization layer is provided with a plurality of grooves, and the grooves are located on the side, away from the substrate, of the metal wiring layer and expose the metal wiring layer. The grooves are filled with a flexible electrode layer, and the flexible electrode layer is coupled to the metal wiring layer located at bottoms of the grooves.

According to the display device in embodiments of the present application, the flexible electrode layer is formed on the metal wiring layer, and dual-channel traces are formed by adopting the metal wiring layer and the flexible electrode layer, so that the resistance is reduced while it is ensured that after the lower metal wiring layer is broken, signals can still be conducted through the upper flexible electrode layer.

With regard to the foregoing method embodiments, for the sake of simple description, the embodiments are all expressed as a series of action combinations, however those skilled in the art should be aware that the present application is not limited by a described sequence of actions due to the fact that according to the present application, some steps can be performed in other orders or simultaneously. Secondly, those skilled in the art should also be aware that the embodiments described in the specification are all optional embodiments, and involved actions and modules are not necessarily required by the present application.

The embodiments in the specification are described in a progressive manner. Each embodiment focuses on explaining differences from other embodiments, and the same or similar parts between the embodiments can be referred to each other.

Finally, it should be noted that in the disclosure, relational terms such as first and second are only used to distinguish one entity or operation from another entity or operation, and do not necessarily require or imply that any such actual relationship or sequence exists between these entities or operations. Moreover, terms "include", "contain" or any other variants thereof are intended to cover non-exclusive inclusion, so that a process, method, commodity or equipment including a series of elements not only includes those elements, but also includes other elements which are not explicitly listed, or also includes elements inherent to the process, method, commodity or equipment. If there are no more restrictions, an element defined by a sentence "including a . . . " does not exclude the existence of other identical elements in the process, method, commodity or equipment that includes the element.

The above provides a detailed introduction to a display panel, a method for preparing the display panel and a display device provided by the present application. Specific examples are adopted in the article to illustrate principles and implementations of the present application. The description of the above embodiments is only for helping understand the methods and core ideas of the present application. For those skilled in the art, according to the ideas of the present application, there will be changes in the specific implementations and applied ranges. In summary, the contents of the specification should not be construed as a limitation on the present application.

What is claimed is:

1. A display panel, wherein the display panel is divided into a display area and a non-display area, and the display panel in the non-display area comprises:
   a substrate;
   a metal wiring layer arranged on the substrate, the metal wiring layer comprising a plurality of metal wirings;
   a planarization layer covering the substrate and the metal wiring layer, the planarization layer being provided with a plurality of grooves corresponding to the plurality of metal wirings, and the grooves each being located on a side, facing away from the substrate, of a metal wiring corresponding to the each groove and exposing the metal wiring; and
   a flexible electrode layer filling the grooves, the flexible electrode layer being coupled to the metal wiring layer located at bottoms of the grooves.

2. The display panel according to claim 1, wherein the display panel in the non-display area further comprises:
   an organic protective layer covering the planarization layer.

3. The display panel according to claim 1, wherein corresponding to any one of the plurality of metal wirings of the metal wiring layer, the planarization layer is provided with a respective one of the grooves.

4. The display panel according to claim 3, wherein a pattern shape of the flexible electrode layer is substantially same as a pattern shape of the metal wiring layer exposed by the grooves of the planarization layer.

5. The display panel according to claim 1, wherein a filling thickness of the flexible electrode layer filling a groove is less than a depth of the groove.

6. The display panel according to claim 1, wherein a material for preparing the flexible electrode layer comprises any one of silver nanowires, silver paste and graphene.

7. A method for preparing a display panel, comprising:
   providing a substrate;
   forming a metal wiring layer on a non-display area of the substrate, the metal wiring layer comprising a plurality of metal wirings;
   forming a planarization layer on the non-display area of the substrate and the metal wiring layer;
   processing the planarization layer to form a plurality of grooves corresponding to the plurality of metal wirings, the grooves each being located on a side, facing away from the substrate, of a metal wiring corresponding to the each groove and exposing the metal wiring; and
   forming a flexible electrode layer in the grooves, the flexible electrode layer being coupled to the metal wiring layer located at bottoms of the grooves.

8. The method according to claim 7, wherein after forming the flexible electrode layer in the grooves, the method further comprises:
   forming an organic protective layer on the flexible electrode layer.

9. The method according to claim 7, wherein said processing the planarization layer to form the plurality of grooves comprises:
   patterning the planarization layer to form the grooves.

10. The method according to claim 7, wherein said processing the planarization layer to form the plurality of grooves comprises:
    imprinting the planarization layer; and
    removing a part of the planarization layer in imprinted areas to form the grooves.

11. The method according to claim 10, further comprising:
    curing a surface of the planarization layer after removing the part of planarization layer in the imprinted areas.

12. The method according to claim 7, wherein before forming the flexible electrode layer in the grooves, the method further comprises:
    performing surface treatment on a surface of the metal wiring layer exposed in the grooves to remove a residual part of the planarization layer on the surface of the metal wiring layer.

13. The method according to claim 7, wherein said forming the flexible electrode layer in the grooves comprises:
    filling a flexible electrode material with a predetermined thickness on the metal wiring layer in the grooves to form the flexible electrode layer.

14. A display device, comprising display panel, wherein the display panel is divided into a display area and a non-display area, and the display panel in the non-display area comprises:
    a substrate:
    a metal wiring layer arranged on the substrate, the metal wiring layer comprising a plurality of metal wirings;
    a planarization layer covering the substrate and the metal wiring layer, the planarization layer being provided with a plurality of grooves corresponding to the plurality of metal wirings, and the grooves each being located on a side, facing away from the substrate, of a metal wiring corresponding to the each groove and exposing the metal wiring; and a flexible electrode layer filling the grooves, the flexible electrode layer being coupled to the metal wiring layer located at bottoms of the grooves.

15. The display device according to claim 14, wherein the display panel in the non-display area further comprises:

an organic protective layer covering the planarization layer.

16. The display device according to claim 14, wherein corresponding to any one of the plurality of metal wirings of the metal wiring layer, the planarization layer is provided with a respective one of the grooves.

17. The display device according to claim 16, wherein a pattern shape of the flexible electrode layer is substantially same as a pattern shape of the metal wiring layer exposed by the grooves of the planarization layer.

18. The display device according to claim 14, wherein a filling thickness of the flexible electrode layer filling a groove is less than a depth of the groove.

19. The display device according to claim 14, wherein a material for preparing the flexible electrode layer comprises any one of silver nanowires, silver paste and graphene.

* * * * *

UNITED STATES PATENT AND TRADEMARK OFFICE
CERTIFICATE OF CORRECTION

PATENT NO. : 11,877,484 B2
APPLICATION NO. : 17/272107
DATED : January 16, 2024
INVENTOR(S) : Shuquan Yang et al.

Page 1 of 1

It is certified that error appears in the above-identified patent and that said Letters Patent is hereby corrected as shown below:

On the Title Page

Column 1, (73) Assignees:
The first Assignee should read Optoelectronics Technology Co., Ltd.

Signed and Sealed this
Twenty-first Day of May, 2024

Katherine Kelly Vidal
*Director of the United States Patent and Trademark Office*